United States Patent [19]

Kodama et al.

[11] Patent Number: 5,437,895
[45] Date of Patent: Aug. 1, 1995

[54] PLASMA CVD PROCESS FOR FORMING AMORPHOUS SILICON THIN FILM

[75] Inventors: Akira Kodama; Yoshimi Watabe; Massashi Ueda, all of Tokyo, Japan

[73] Assignee: Anelva Corporation, Fuchu, Japan

[21] Appl. No.: 276,906

[22] Filed: Jul. 19, 1994

[30] Foreign Application Priority Data

Sep. 21, 1993 [JP] Japan .................. 5-234705

[51] Int. Cl.⁶ .............................................. B05D 3/06
[52] U.S. Cl. ..................... 427/578; 427/579; 427/109
[58] Field of Search ............. 427/578, 569, 579, 109; 148/DIG. 1

[56] References Cited

U.S. PATENT DOCUMENTS 4,950,956  8/1990  Asamaki et al. ............. 315/111.21

FOREIGN PATENT DOCUMENTS

| | | |
|---|---|---|
| 5-15753 | 3/1993 | Japan . |
| 5-156451 | 6/1993 | Japan . |
| 5-156452 | 6/1993 | Japan . |
| 5-156453 | 6/1993 | Japan . |
| 5-160044 | 6/1993 | Japan . |
| 5-160045 | 6/1993 | Japan . |
| 5-218004 | 8/1993 | Japan . |
| 5-218005 | 8/1993 | Japan . |
| 5-335244 | 12/1993 | Japan . |

OTHER PUBLICATIONS

Watanabe, Y. et al., Powder-free plasma chemical vapor deposition of hydrogenated amorphous silicon with high rf power density using modulated rf discharge, Appl. Phys. Lett. 57 (16), Oct., 1990, pp. 1616–1618.

Denisse, C. M. M. et al., Plasma-enhanced growth and composition of silicon oxynitride films, J. Appl. Phys. 60(7), Oct. 1966, pp. 2536–2542.

Boswell, R. W. et al., Pulsed high rate plasma etching with variable Si/SiO₂ selectivity and variable Si etch profiles, Appl. Phys. Lett. 47(10), Nov. 1985, pp. 1095–1097.

Andujar, J. L. et al., Properties of amorphous silicon thin films grown in square wave modulated silane rf discharges, J. Appl. Phys. 71(3), pp. 1546–1548.

Lloret, A. et al., Ellipsometric study of a-Si:H thin film deposited by square wave modulated rf glow discharge, J. Appl. Phys. 69(2), pp. 632–638.

Overzet, Lawrence J. et al., Modeling and measurements of the negative ion flux amplitude modulated rf discharges, J. Appl. Phys. 72(12), Dec. 1992, pp. 5579–5592.

Overzet, J. J. et al., Enchancement of the negative ion flux to surfaces from radio-frequency processing discharges, J. Appl. Phys 66(4), Aug. 1989, pp. 1622–1631.

Overzet, L. J. et al., Enhancement of the plasma density and deposition rate in rf discharges, Appl. Phys. Lett. 48(11), Mar. 1986, pp. 695–697.

Shiratani, Masaharu et al., Reaction Control in Processing Plasmas by Square-Wave-Amplitude-Modulating RF Voltage, Technology Reports of Kyushu University, vol. 62, No. 6., Dec. 1989, pp. 677–682.

Watanabe, Yukio et al., Reincrease in Electron Density in the Current-Decaying Phase of Pulsed-Discharge of Argon-Hydrogen Mixture, Japanese Journal of Applied Physics, vol. 27, No. 8, Aug. 1988, pp. 1469–1476.

Watanabe, Y. et al., effects of low-frequency modula- (List continued on next page.)

*Primary Examiner*—Roy V. King
*Attorney, Agent, or Firm*—Burns, Doane, Swecker & Mathis

[57] ABSTRACT

A process for forming a thin film of amorphous silicon of a uniform thickness on a relatively large glass plate. The process comprising forming a thin film of amorphous silicon on an insulating substrate by a plasma enhanced chemical vapor deposition process while intermittently generating a high frequency discharge. The duration of each discharge is set shorter than the time period necessary for the DC bias voltage, which is generated on the high frequency-applying electrode side, to attain a saturated value.

10 Claims, 3 Drawing Sheets

OTHER PUBLICATIONS tion on rf discharge chemical vapor deposition, Appl. Phys. Lett. 53(14), Oct. 1986, pp. 1263–1265.

Hirose, M. et al., Thin film preparation technique utilizing plasma, Oyo Butsuri, vol. 52, No. 8, Aug. 1989, pp. 657–666.

Shiratani, M. et al., Reaction mechanism in modulated rf discharge silane plasma, Proceedings of Symposium on Plasma in IEE Japan, Aug. 1989.

Togawa, J. et al., High Rate Deposition of a-Si:H Film by PE–CVD System, Extended Abstracts in the 40th Spring Meeting, Mar. 1993.

PLASMA CVD PROCESS FOR FORMING AMORPHOUS SILICON THIN FILM

BACKGROUND OF THE INVENTION

1. Field of the Invention

The present invention relates to a process for forming a thin film of amorphous silicon on the surface of an insulating substrate such as a glass plate.

2. Description of Related Art

Thin films of amorphous silicon have been fabricated heretofore by a plasma enhanced chemical vapor deposition process (hereinafter abbreviated to "PECVD") comprising:

introducing a silane ($SiH_4$) gas or a mixture of silane gas and hydrogen ($H_2$) gas as a starting material into a film deposition (vacuum) chamber;

applying a high frequency power across a pair of facing electrodes to produce a plasma by electric discharge; and exciting and decomposing the starting material gas to form a thin film of amorphous silicon on the surface of a substrate supported by one of the electrodes.

This film deposition process has been applied to the production of thin film transistors (TFTs) for use in liquid crystal displays (LCDs) or in flat panel displays. In general, the TFT elements are formed on a glass plate. However, the size of the glass plate has been getting larger recently because the size of the liquid crystal displays has been increasing. A key point in the fabrication of large liquid crystal displays of high quality is to deposit a film having a uniform film thickness. Thin films of amorphous silicon are no exception, and uniformity in the film thickness is recognized as an important factor to be fulfilled in their deposition.

In forming a thin film of amorphous silicon by PECVD, it is well known that the film thickness uniformity depends on the distribution of the plasma density at the surface of the substrate. That is, it is known that the PECVD reaction can be promoted by increasing the plasma density, and therefore films can be deposited at a higher rate by increasing the plasma density. This also means that portions of a film deposited where the plasma density is high will be thicker than portions of the film deposited where the plasma density is lower. Therefore, to obtain a good film with a uniform thickness, a plasma with a uniform density distribution must be formed between the facing electrodes.

The discharge between the facing electrodes can be effected in either of two ways: one is a continuous discharge method; the other is an intermittent discharge method in which a square wave amplitude-modulated discharge is used.

The continuous discharge method is the PECVD process that has generally been employed, and is characterized in that it enables the deposition of high-quality thin films of amorphous silicon while maintaining the substrate at a relatively low temperature of about 250° C. When depositing a thin film of amorphous silicon on a glass plate having a large area (e.g., 20×20 cm²), however, this method is problematic because such a large thin film of uniform thickness cannot be obtained.

The method using intermittent discharge comprises applying a square wave amplitude-modulated radio frequency (rf) between the facing electrodes. The other basic film deposition conditions (pressure, substrate temperature, the composition and the flow rate of the starting material gas) are the same as those used in the continuous discharge method. The square wave amplitude-modulated discharge method was initially proposed by Overzet et al. (see L. J. Overzet et al., Appl. Phys. Lett. 48(11), pp. 695–97 (1986)). This method has been studied in further detail by Watanabe et al. of Kyushu University. See Y. Watanabe et al., Appl. Phys. Lett. 53 (14), pp. 1263–65 (1988), M. Shiratani et al., IEE Japan, Proceedings of Symposium on Plasma (Plasma Kenkyu-kai Shiryou), EP-89-62 (1989), and Y. Watanabe et al., Appl. Phys. Lett. 57(16), pp 1616–18 (1990).

Watanabe et al. have reported that a film of high quality can be formed by applying the intermittent discharge method, i.e., the method of square wave modulating an rf discharge, to a conventional PECVD process without preventing the formation of radicals necessary for forming a film of high quality and while greatly suppressing the generation of dust particles throughout the entire discharge space. They have reported conclusively that their process enables the formation of a thin film at a high deposition rate while considerably reducing the particle diameter and quantity of the dust particles which form in the discharge space.

Furthermore, Denisse et al. of Utrecht State University have reported the application of the intermittent discharge method to a process for depositing a thin film of $SiO_xN_y$. See C. M. M. Denisse et al., J. Appl. Phys. 60(7), pp. 2536–42 (1986).

A conventional process for depositing a film of $SiO_xN_y$ comprises carrying out ordinary continuous discharge PECVD by introducing a mixture of $SiH_4$, $N_2O$, and $NH_3$ gases into the vacuum vessel. However, the composition ratio of the gas mixture during this process changes from the vicinity of the gas inlet to the vicinity of the gas outlet, resulting in a film whose thickness differs from place to place. This problem of the composition ratio changing occurs because the plasma reaction consumes the gas mixture introduced through the inlet as the gas flows through the vacuum vessel.

As a solution to this problem, Denisse et al. proposed the use of an intermittent discharge method in depositing thin films. They used a 1 kW radio frequency generator operating at 400 kHz and being modulated by a pulse with a frequency of about 4 Hz (about 250 ms per cycle) and a pulse width of about 100 ms. The plasma was generated intermittently with discharge occurring for a duration of about 100 ms and ceasing thereafter for about 150 ms to allow the recovery of the initial composition ratio. Thus, the gas composition ratio in the discharge space could be maintained constant and film of uniform thickness could be deposited.

However, the PECVD processes using the intermittent discharge method described above do not enable the deposition of a thin film of amorphous silicon with uniform thickness over the entire surface of a large insulating substrate (e.g., a glass plate 20×20 cm² in area).

As described in the foregoing, a PECVD based on the continuous discharge method is disadvantageous in that it cannot be applied to the deposition of a thin film of amorphous silicon having a uniform thickness on a large glass plate. FIG. 3 shows an example of a film deposited by the continuous discharge method. It can be seen that the film is relatively thin in the central portion of the substrate and that it is thicker at the edges of the substrate, i.e., at portions near the metallic substrate holder which is grounded.

OBJECTS AND SUMMARY

Accordingly, an object of the present invention is to provide a process for forming a thin film of amorphous silicon of a uniform thickness over the entire surface of a relatively large insulating substrate.

The above object is accomplished by a process for forming a thin film of amorphous silicon on an insulating substrate by plasma enhanced chemical vapor deposition (PECVD), comprising intermittently generating a high frequency discharge, wherein the duration of each discharge is set shorter than the time period necessary for the DC bias voltage, which is generated on the high frequency-applying electrode side, to attain a maximum constant value.

The process above preferably comprises intermittently generating a high frequency discharge, wherein the duration for which the discharge is ceased is set longer than the time period necessary for the DC bias voltage, which is generated on the high frequency-applying electrode side, to reach zero volts.

The above-mentioned process preferably comprises generating a high frequency discharge intermittently at a modulation frequency in the range of from 100 Hz to 100 kHz, and at a duty ratio of 1% or greater, but less than 100%. The process more preferably comprises generating a high frequency discharge intermittently at a modulation frequency of more than 500 Hz to less than 5 kHz, and a duty ratio of 1% or greater, but less than 100%.

The process above preferably comprises generating a high frequency discharge intermittently at a modulation frequency of 1 kHz and at a duty ratio of 20%.

DETAILED DESCRIPTION OF THE PREFERRED EMBODIMENT

Figure 3:
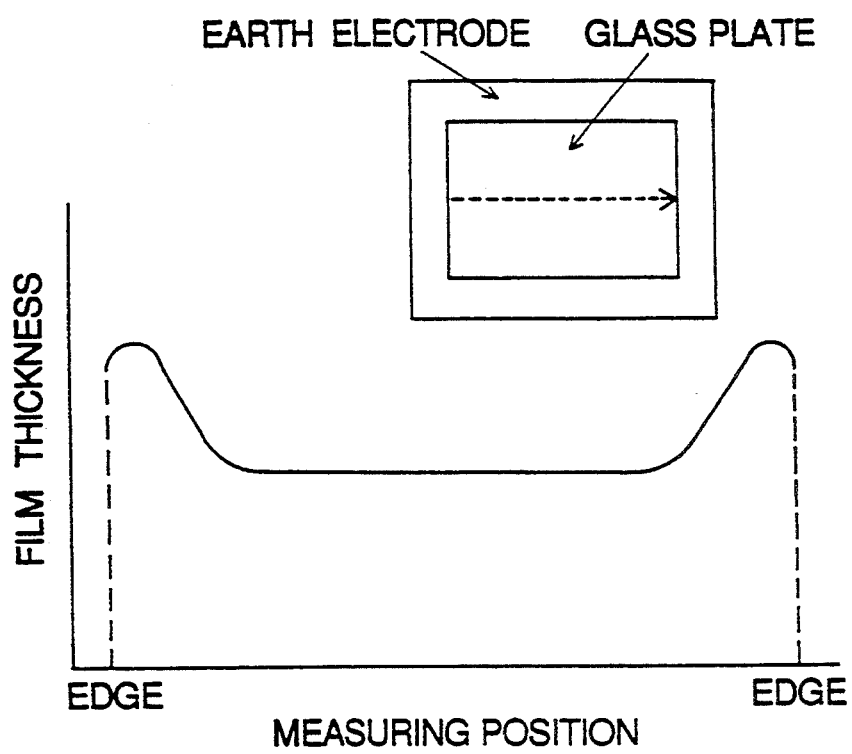
FIG. 3 is a graph showing the thickness distribution of a thin film of amorphous silicon deposited by the continuous discharge method of the prior art.

The film thickness distribution of a thin film of amorphous silicon deposited by PECVD greatly depends on the distribution of the plasma density in the vicinity of the substrate. A thin film deposited by a conventional continuous discharge PECVD process generally exhibits the thickness distribution illustrated in FIG. 3. The film is relatively thin in the central portion of the substrate and is thicker at the edges of the substrate, near the grounded metallic substrate holder. Accordingly, a reason for the impaired uniformity in film thickness may be attributed to the nonuniformity of the plasma density between the facing electrodes. Presumably, the plasma density is higher at the edge portions nearer the metallic substrate holder, and lower at the central portion of the substrate.

The present inventors have found that saturation of the DC bias voltage $V_{dc}$ on the high-frequency applying electrode upon initiation of the discharge leads to the formation of such a nonuniformity in the plasma density. More specifically, the high frequency current which is supplied to the insulating substrate via the plasma tends to concentrate more easily on the metallic substrate holder than on the insulating substrate as the area of the insulating substrate (e.g., a glass plate) increases, and the mechanism by which the plasma is maintained becomes more dependent on the process of secondary electron emission. Therefore, it is seen that such nonuniformity in the plasma density is formed via the steps of generating a DC bias voltage $V_{dc}$ on the high-frequency applying electrode after the initiation of discharge, and said DC bias voltage attaining a saturated state.

A preferred embodiment of the present invention includes depositing a thin film having a uniform film thickness distribution by taking advantage of the relation between the plasma density and the DC bias voltage described above. In the process according to the present invention the high frequency discharge is turned off before the DC bias voltage attains a saturated state, i.e., before the plasma density distribution becomes nonuniform. The step of turning on and off the high frequency discharge is repeated several times during the deposition process. In other words, the condition of intermittent discharge is preferably set so that the high frequency discharge is turned off before the DC bias voltage achieves a constant maximum value. As described in the foregoing, such process overcomes the fundamental problem causing nonuniformity in the plasma density and realizes the formation of a thin film of amorphous silicon with a uniform film thickness distribution.

As mentioned in the foregoing, the PECVD process based on the intermittent discharge method is known to greatly suppress the generation of dust particles over the entire discharge space during the deposition of a thin film of amorphous silicon. A process according to the present invention also provides the same functions and advantages as those of prior intermittent discharge method processes.

The present invention is illustrated below in greater detail with reference to a nonlimiting example and the accompanying drawings. It should be understood, however, that the present invention is not to be construed as being limited thereto.

EXAMPLE

Referring to FIG. 1(a), an apparatus used in a preferred embodiment according to the present invention is described below. A high frequency applying electrode 2 and a ground electrode 3 are placed inside a vacuum vessel 1 in such a manner that they face each other. The ground electrode 3 can hold four glass plates 4 at a time. A high frequency power source (an rf power source) 11 is connected to the high frequency applying electrode 2 via a matching circuit 12. A pulse generator 13 is connected to the high frequency power source 11. With this set-up, continuous high frequency power 15 can be modulated into amplitude modulated high frequency power 16 by means of a modulation signal 14 generated by the pulse generator 13.

A gas inlet system comprising a flow controller 6 for introducing a starting material gas 5 (a mixture of SiH4 gas and H2 gas) at a desired flow rate is connected to the vacuum vessel 1. A gas pumping system 9 is also connected to the vacuum vessel 1 via a variable conductance valve 8 to control the pressure within the vacuum vessel 1 to a predetermined value. The pressure within the vacuum vessel is measured by a pressure gauge 7.

The ground electrode 3 comprises a built-in substrate heating mechanism 10 to heat the glass plates 4.

Referring to FIG. 1(a), a plasma 17 is generated between the high frequency applying electrode 2 and the ground electrode 3.

Figure 1:
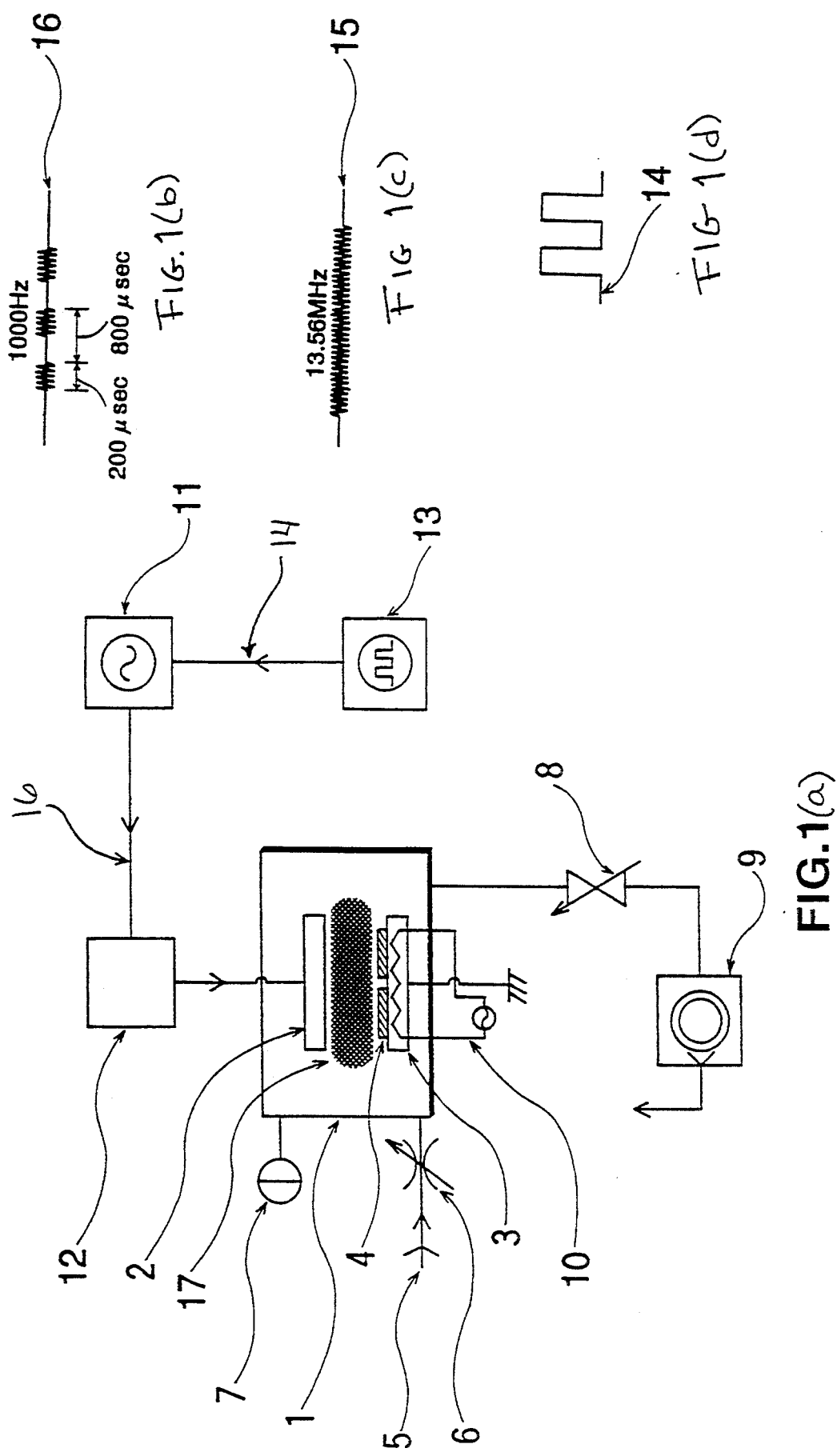
FIG. 1(a) shows a diagram of a PECVD apparatus used in a preferred embodiment according to the present invention.
FIG. 1(b) shows an amplitude modulated high frequency signal.
FIG. 1(c) shows a continuous high frequency signal.
FIG. 1(d) shows the modulation signal outputted by a pulse generator.

The process for depositing a thin film of amorphous silicon using the film deposition apparatus illustrated in FIG. 1 is described below.

Glass plates 4 are first attached to the ground electrode 3, and the inside of the vacuum vessel 1 is evacuated to a pressure of about $5 \times 10^{-3}$ Pa ($3.8 \times 10^{-5}$ Torr). The starting material gas 5 is then introduced into the vessel through the flow controller 6 to bring the inner pressure of the vacuum vessel to a desired pressure of about 90 Pa. The pressure can be controlled by means of the variable conductance valve 8.

High frequency power is then applied across the high frequency applying electrode 2 and the ground electrode 3 to generate a plasma 17 therebetween. The film deposition starts after the ignition of the plasma 17. In the case of the continuous discharge method, a high frequency power source 11 is operated to produce a continuous high frequency power 15. In the case of the intermittent discharge method, a pulse generator 13 is operated at the same time with the high frequency power source 11 to produce an amplitude-modulated high frequency power 16 by amplitude-modulating a high frequency power from the high frequency power source 11 using a desired modulation signal 14 outputted by the pulse generator 13.

Figure 2:
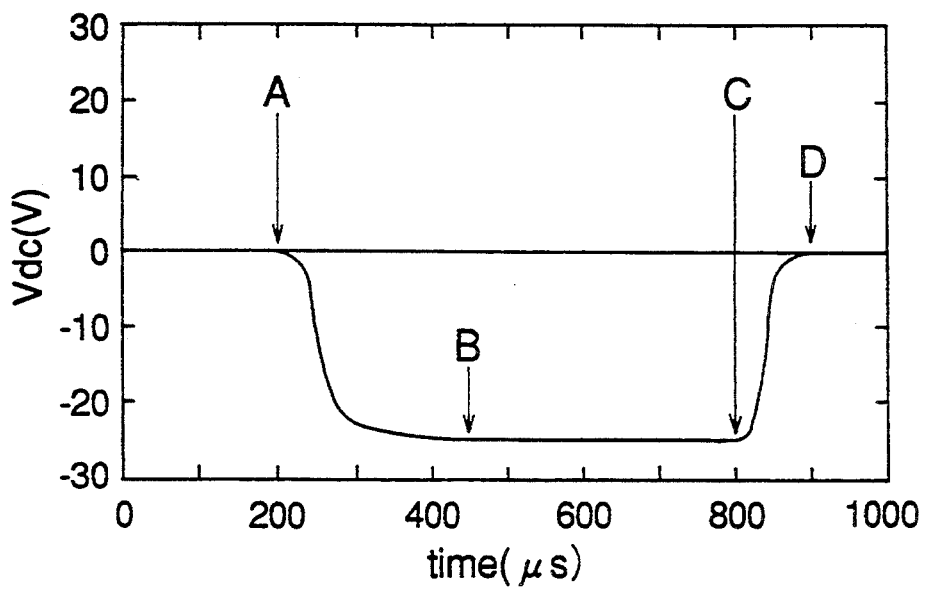
FIG. 2(a) shows a waveform of a DC bias voltage on the high-frequency applied electrode as observed on an oscilloscope, according to a preferred embodiment of the present invention.
FIG. 2(b) is a graph showing the thickness distribution of a thin film of amorphous silicon deposited on a glass plate according to a preferred embodiment of the present invention.
Figure 2:
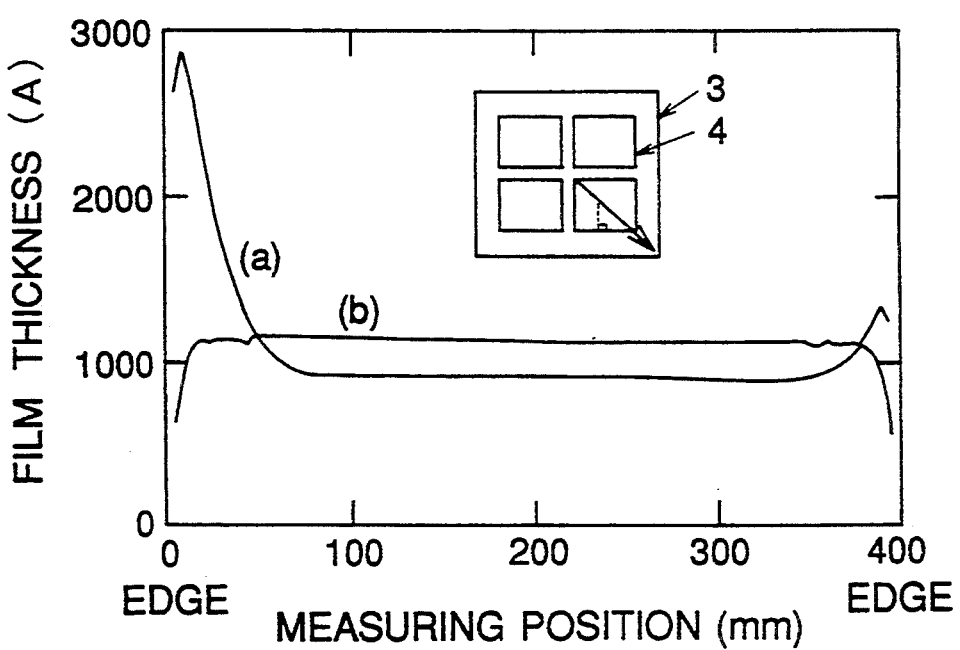

FIG. 2(a) shows the change of DC bias voltage from the initiation of discharge through the turning-off of the discharge, until the complete disappearance of the DC bias voltage. The DC bias voltage was measured by generating a high frequency discharge in the vacuum vessel having therein four glass plates 4 (30 cm × 40 cm in size) supported by the ground electrode 3, and connecting a 1,000:1 probe in the path of the high frequency power just before the high frequency applying electrode 2. The waveform of the measured DC bias voltage is monitored on an oscilloscope. In the figure, the point marked A corresponds to the initiation of discharge. It can be seen that the DC bias voltage attains a saturated state shown by the constant maximum value, at point B, about 250 μsec after the initiation of discharge. The DC bias voltage may be about −25 V. Discharge is stopped at point C. The DC bias voltage disappears completely (returns to 0 volts) at point D, about 100 82 sec after the point C, to recover a stable state.

The condition of the intermittent discharge is set so that the duration of discharge may be 250 μsec or less and that the discharge may be stopped for a time period of 100 μsec or longer. Thus, the deposition of a thin film of amorphous silicon in this example was performed by an intermittent discharge process under conditions fulfilling the requirements above. More specifically, the process was carried out at a modulation frequency of 1,000 Hz (1 kHz) and a duty ratio of 20% (discharge maintained for a duration of 200 μsec and the discharge stopped for 800 μsec). For comparison with the continuous discharge method, another thin film of amorphous silicon was deposited by PECVD by the continuous discharge method. The conditions of the film deposition are listed in Table 1. The conditions include, for example, the distance between the facing electrodes, i.e., the high frequency applying electrode 2 and the ground electrode 3, and the flow rate of the starting material gas.

TABLE 1

| Discharge Method | Film Deposition Conditions | |
|---|---|---|
|  | Continuous | Intermittent |
| Interelectrode distance (cm) | 3 | 3 |
| Flow rate of SiH4 (sccm) | 500 | 500 |
| Flow rate of H2 (sccm) | 1500 | 1500 |
| Pressure (Pa) | 90 | 90 |
| RF power (W) | 220 | 1050 |
| Modulation frequency (Hz) | — | 1000 |
| Duty ratio (%) | — | 20 |
| Duration of Film Deposition (min) | 10 | 10 |

FIG. 2(b) shows the thickness distribution of a thin film of amorphous silicon deposited on the glass plate 4. The thickness of the deposited film was measured along a diagonal of the glass plate, as indicated with an arrow in FIG. 2(b). The abscissa of the graph of FIG. 2(b) shows the positions on the longer edge of the glass plate 4 corresponding to the measured points on the diagonal. Each position on the longer edge is obtained as a crossing point of the longer edge and a perpendicular drawn from the longer edge to a measuring point on the diagonal. The curve marked (a) represents the film thickness distribution for a film deposited by the continuous discharge method, and the curve marked (b) shows the film thickness distribution for a film deposited by the intermittent discharge method.

Comparing, for instance, the film uniformity at a point 1.5 cm or more distant from the edge of the glass plate, a value of ±48% is obtained in the case of the continuous discharge method, which is in great contrast to the variation of ±2.2% obtained in the case of the intermittent discharge method. Accordingly, it can be seen that a greatly improved film thickness uniformity can be obtained by forming the thin film of amorphous silicon by the intermittent discharge method according to the present invention.

As described in detail in the foregoing, the present invention provides a way of forming a thin film of amorphous silicon of a uniform thickness on a relatively large glass plate. The present invention is therefore of great use in manufacturing large liquid crystal displays of high quality.

While the invention has been described in detail with reference to specific embodiments thereof, it will be apparent to one skilled in the art that various changes and modifications can be made without departing from the spirit and scope thereof.

What is claimed is:

1. A process for forming a silicon containing thin film on an insulating substrate by a plasma enhanced chemical vapor deposition process, comprising the steps of:
   intermittently generating a high frequency discharge between a high frequency applying electrode and a ground electrode, wherein a duration of each discharge is shorter than a time period necessary for a DC bias voltage, which is generated on the high frequency-applying electrode side, to attain a maximum constant value; and providing a starting material gas in the vicinity of the high frequency discharge.

2. The process for forming a thin film as claimed in claim 1, wherein a duration for which the discharge is ceased is set longer than a time period necessary for the DC bias voltage, which is generated on the high frequency-applying electrode side, to reach zero volts.

3. The process for forming a thin film as claimed in claim 2, wherein the intermittent generation of the high frequency discharge is effected at a modulation frequency in the range of from about 100 Hz to 100 kHz, and at a duty ratio of about 1% or greater but less than 100%.

4. The process for forming a thin film as claimed in claim 2, wherein the intermittent generation of the high frequency discharge is effected at a modulation frequency in the range of from greater than 500 Hz to less than 5 kHz, and at a duty ratio of about 1% or greater but less than 100%.

5. The process for forming a thin film as claimed in claim 3, wherein the intermittent generation of the high frequency discharge is effected at a modulation frequency of about 1 kHz and at a duty ratio of about 20%.

6. The process for forming a thin film as claimed in claim 5, wherein the thin film is made of amorphous silicon.

7. The process for forming a thin film as claimed in claim 1, wherein a uniform thin film is formed on an insulating substrate of at least 400 $cm^2$ in area.

8. The process for forming a thin film as claimed in claim 1, wherein the discharge is stopped when the DC bias voltage reaches a maximum constant value of $-25$ V.

9. A process for forming a silicon containing thin film on an insulating substrate by a plasma enhanced chemical vapor deposition process, comprising the steps of:

providing a high frequency applying electrode and a ground electrode;

determining a time period necessary for a DC bias voltage, which is generated on the high frequency applying electrode side, to attain a maximum value;

intermittently generating a high frequency discharge between the high frequency applying electrode and the ground electrode, wherein the duration of each discharge is shorter than the time period necessary for the DC bias voltage to attain said maximum value; and providing a starting material gas in the vicinity of the high frequency discharge.

10. The process for forming a thin film as claimed in claim 9, further comprising selecting a modulation frequency and a duty ratio for the intermittent generation of the high frequency discharge based on the time period necessary for a DC bias voltage to attain said maximum value.

* * * * *

UNITED STATES PATENT AND TRADEMARK OFFICE
CERTIFICATE OF CORRECTION

PATENT NO. : 5,437,895
DATED : August 1, 1995
INVENTOR(S) : Akira KODAMA et al

It is certified that error appears in the above-indentified patent and that said Letters Patent is hereby corrected as shown below:

```
On the title page item [75], delete
```

"Massashi" and insert -- Masashi --.

Signed and Sealed this

Nineteenth Day of September, 1995

*Attest:*

BRUCE LEHMAN

*Attesting Officer*     Commissioner of Patents and Trademarks